United States Patent
Funyu et al.

(10) Patent No.: US 6,949,976 B2
(45) Date of Patent: Sep. 27, 2005

(54) DISTORTION COMPENSATING AMPLIFIER DEVICE, AMPLIFIER SYSTEM, AND WIRELESS BASE STATION

(75) Inventors: Yasuhito Funyu, Kawasaki (JP); Takao Sasaki, Kawasaki (JP); Hiromi Miyamoto, Kawasaki (JP); Takeshi Ohba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/022,239

(22) Filed: Dec. 23, 2004

(65) Prior Publication Data

US 2005/0104658 A1 May 19, 2005

Related U.S. Application Data

(63) Continuation of application No. PCT/JP02/10549, filed on Oct. 10, 2002.

(51) Int. Cl.[7] ................................................ H03F 1/26
(52) U.S. Cl. ............................ 330/149; 330/2; 375/297; 455/63.1
(58) Field of Search ........................... 330/2, 136, 149; 455/126; 375/296, 297

(56) References Cited

U.S. PATENT DOCUMENTS 6,498,529 B1 * 12/2002 Kim et al. .................. 330/149
6,657,493 B2 * 12/2003 Ode et al. ................... 330/149

2001/0005402 A1   6/2001  Nagatani et al.
2001/0051504 A1  12/2001  Kubo et al.

FOREIGN PATENT DOCUMENTS

| JP | 63-208330 | 8/1988 |
| JP | 2001-189685 | 7/2001 |
| JP | 2001-345718 | 12/2001 |
| JP | 2002-190712 | 7/2002 |

OTHER PUBLICATIONS

International Search Report dated Jan. 21, 2003.

* cited by examiner

*Primary Examiner*—Khanh V. Nguyen
(74) *Attorney, Agent, or Firm*—Katten Muchin Rosenman LLP

(57) ABSTRACT

A distortion compensating amplifier device is disclosed that maintains uniform delay amounts between a transmission input signal and a transmission output signal, even if there is a change in the device characteristics. The distortion compensating amplifier device of a digital predistortion type includes a second delay circuit that delays the transmission input signal; a distortion compensating circuit that performs predistortion compensation on the delayed signal, using a distortion compensating parameter; an amplifier that amplifies the signal subjected to the predistortion compensation; a first delay circuit that further delays the signal delayed by the second delay circuit; and a calculator that calculates the distortion compensating parameter to be used in the predistortion compensation, based on the difference between the signal output from the first delay circuit and the amplified signal.

15 Claims, 6 Drawing Sheets

DISTORTION COMPENSATING AMPLIFIER DEVICE, AMPLIFIER SYSTEM, AND WIRELESS BASE STATION

CROSS-REFERENCE TO RELATED APPLICATION

This application is a U.S. continuation application filed under 35 USC 111(a) claiming benefit under 35 USC 120 and 365(c) of PCT International Application No. PCT/JP02/10549 filed on Oct. 10, 2002, which is hereby incorporated herein by reference.

FIELD OF THE INVENTION

The present invention generally relates to digital predistortion compensating amplifier devices that are used in general wireless transmitters, and, more particularly, to a digital predistortion compensating amplifier device that is used in wireless base stations of mobile communication systems, and a wireless base station that includes the amplifier device.

BACKGROUND OF THE INVENTION

Wireless base stations in a wireless communication system such as a mobile communication system, a trunk communication system, or a broadcasting system, transmit radio signals with relatively large power outputs. Each power amplifier used in a transmission device is expected to output signals that have linearity with respect to input power, but exhibits non-linear, distorted components in reality. Due to the non-linearity of each power amplifier, unnecessary signal components are contained in output signals of the power amplifier, resulting in a distorted output waveform. If the side lobe exceeds the tolerance value on a frequency spectrum plot due to the unnecessary signal components, the neighboring channels are disturbed. To counter the non-linearity in the power amplifier, not only a waveform rectifying operation using a filter device but also a digital predistortion technique should be additionally employed in a conventional operation.

Figure 1:
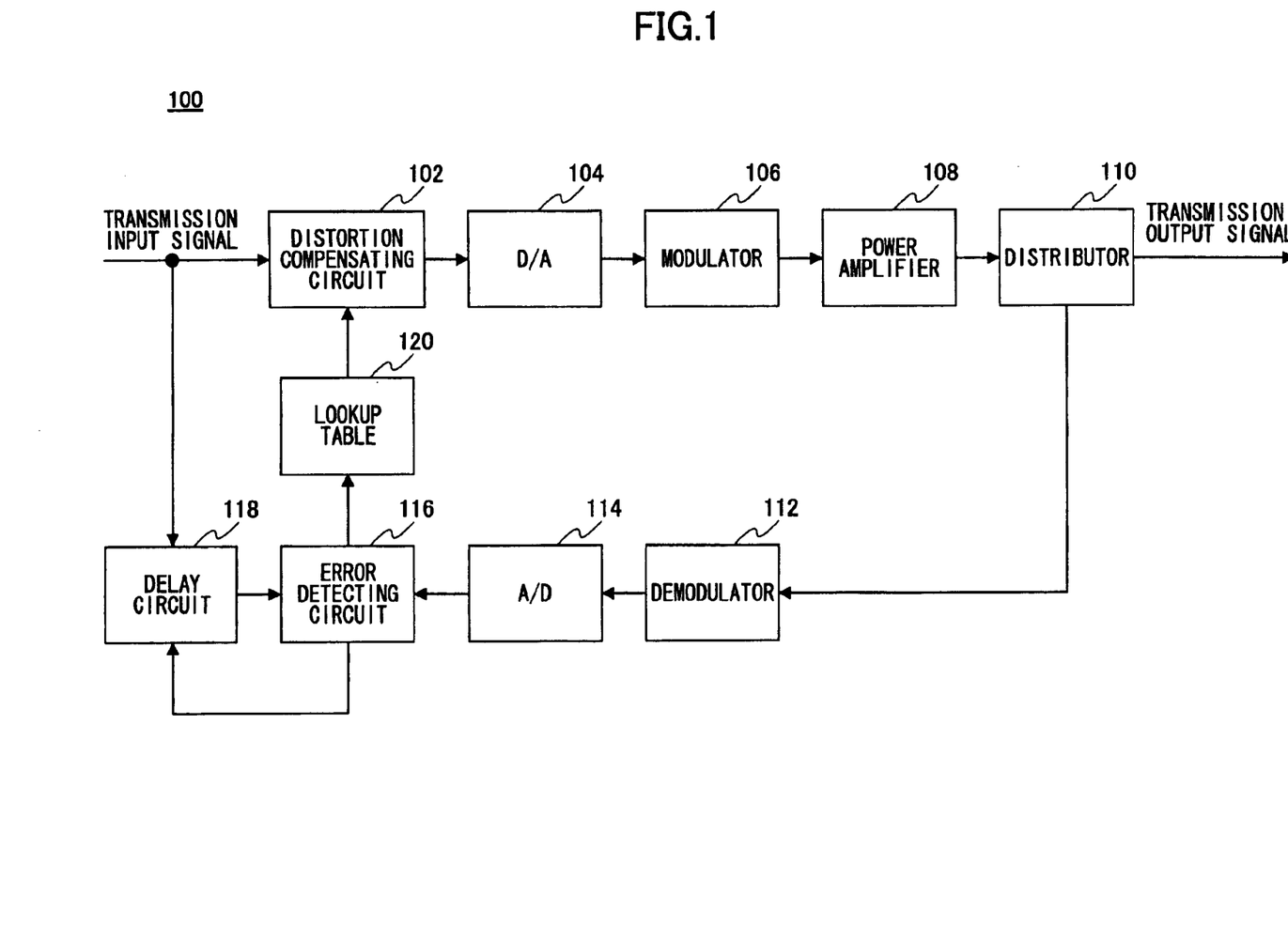
FIG. 1 is a block diagram of a conventional distortion compensating amplifier device.

FIG. 1 is a block diagram of an amplifier device 100 that performs distortion compensation by the above mentioned technique. The amplifier device 100 converts a transmission input signal that is a digital baseband signal into a predistortion signal, using distortion compensating parameters read out from a lookup table 120. The predistortion signal is then converted into an analog signal by a digital-to-analog converter 104. A modulator 106 performs a modulating operation using the input analog signal. The modulated signal is a signal in the 800 MHz band that is used by general cellular telephone systems, or a signal in the 2 GHz band of IMT 2000. The modulated signal is then amplified by a power amplifier 108, and is transmitted through an antenna (not shown).

Part of the transmission signal is supplied to a demodulator 112 via a distributor 110. The demodulator 112 performs a demodulating operation to output a demodulated signal. The demodulated signal is then converted into a digital signal by an analog-to-digital converter 114, and is input to one of the two input ends of an error detecting circuit 116. A delay signal that is formed by delaying a transmission input signal by a delay circuit 118 is input to the other input end of the error detecting circuit 116. The delay amount at the delay circuit 118 is equivalent to the delay caused in the transmission input signal passing through the distributor 110 and reaching the error detecting circuit 116. Based on the difference between the feedback signal and the delayed signal, the error detecting circuit 116 outputs an error signal. The feedback signal is a signal based on the amplified signal, but is attenuated by the distributor or the like. Ideally, the signal output from the delay circuit 118 is equal to the feedback signal output from the analog-to-digital converter 114. More specifically, the error detecting circuit 116 measures the difference between the signal output from the delay circuit 118 and the feedback signal, and then changes the delay amount at the delay circuit 118 so as to reduce the difference. The delay amount is fixed to the value with which the difference is minimized, and the distortion compensating parameters in the lookup table 120 are updated. Thus, the error at the error detecting circuit 116 is controlled to become smaller. The updated distortion compensating parameters are supplied to the distortion compensating circuit 102.

The distortion compensating parameters are used to change the gain (amplitude) and phase of a transmission input signal in advance (to provide the opposite distortion characteristics), so that a transmission output signal having suitable linearity for the transmission input signal can be obtained. The signal having the opposite distortion characteristics is distorted at the modulator 106, the power amplifier 108, or the like, but is finally output with the desired characteristics. In an operating state, the updating of the delay amount in the delay circuit is performed at longer intervals than the updating of the lookup table, so that each of the parameters can be properly updated.

Although the distortion compensating circuit 102 appears to process a single signal in the structure shown in FIG. 1, each of the two types of signals Ich and Qch is processed in a case where the modulator 106 performs quadrature modulation.

The amplifier device 100 shown in FIG. 1 includes a number of analog devices. Foe example, a power amplifier is generally formed with a number of stages of analog devices. Also, it is necessary to employ a number of devices (such as inductors and capacitors) to obtain a steep profile in the characteristics of a filter for removing unnecessary waves. In general, analog devices exhibit various characteristics, and there are changes in the characteristics due to temperature change, change in properties with time, or the like. The changes in the characteristics might change the signal propagation time or the delay amount (and the phase angle) in each signal path. In short, the period of time existing between the inputting of a transmission input signal to the amplifier device 100 and the outputting of a transmission output signal from the amplifier device 100 (and the period of time required for obtaining a feedback signal) is changed. In such a case, the amplifier device 100 detects the change in the delay amount, and adjusts the delay amount at the delay circuit 118, based on the difference between the feedback signal and the delayed signal. In this manner, the amplifier device 100 can output a distortion-compensated transmission signal, coping with changes in the delay amount due to changes in properties with time or the likes.

There is a wireless base station in which amplifier devices of the above described type are operated in parallel and outputs of the amplifier devices are combined. The combining of the outputs of the amplifier devices is performed to obtain a larger power output, for example. Each of the paths is also connected to an antenna, so that the amplified outputs can be spatially combined while the phase of each path is adjusted. In this manner, an antenna beam of the desired directivity can be formed (transmission diversity). In the case of combining the amplified outputs in such a manner, it is necessary to make the delay amounts (and the phases) of the paths precisely equal to one another.

However, when the delay amount in each signal path changes due to a change in the analog device characteristics with temperature and time, the delay amounts vary between a transmission input signal and a transmission output signal at each signal path. As a result, signals of different timing properties are combined, and a desired large output and a desired antenna beam pattern might not be obtained.

Japanese Unexamined Patent Publication Nos. 63-208330, 2001-189685, and 2001-345718 disclose conventional distortion compensating amplifier devices. However, none of those devices is designed to properly combine the amplified outputs of two or more signal paths.

SUMMARY OF THE INVENTION

A general object of the present invention is to provide a distortion compensating amplifier device and an amplifier system that can maintain uniform delay amounts between a transmission input signal and a transmission output signal, even if there is a change in the device characteristics due to a temperature change, a change in properties with time, or the like.

A more specific object of the present invention is to provide a distortion compensating amplifier device and an amplifier system that can properly combine amplified outputs of parallel signal paths, even if there is a change in the device characteristics due to a change in properties with time or the like.

The present invention provides a distortion compensating amplifier device of a digital predistortion type that includes:

a second delay circuit that delays a transmission input signal;

a distortion compensating circuit that performs predistortion compensation on the delayed signal, using a distortion compensating parameter;

an amplifier that amplifies the signal subjected to the predistortion compensation;

a first delay circuit that further delays the signal delayed by the second delay circuit; and a calculator that calculates the distortion compensating parameter to be used in the predistortion compensation, based on the difference between the signal output from the first delay circuit and the amplified signal.

DESCRIPTION OF THE PREFERRED EMBODIMENTS

Figure 2:
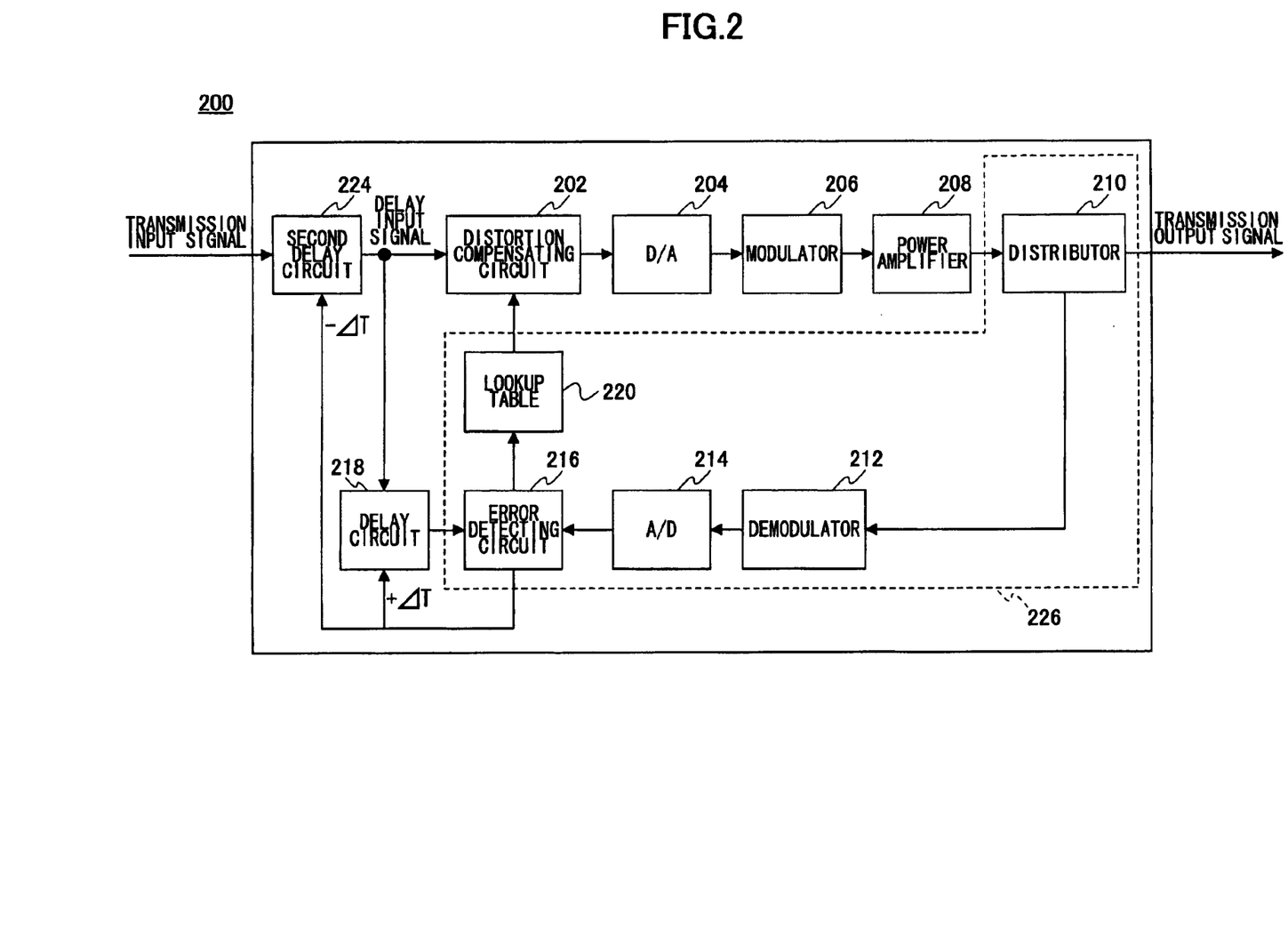
FIG. 2 is a block diagram of a distortion compensating amplifier device in accordance with a first embodiment of the present invention.

FIG. 2 is a block diagram of an amplifier device 200 that compensates for distortions in accordance with a first embodiment of the present invention. This amplifier device 200 can be used in the wireless base stations of wireless communication systems. Except for the parts related to the second delay circuit shown in the left half of the drawing, the amplifier device 200 is substantially the same as the amplifier device 100 shown in FIG. 1.

The amplifier device 200 includes a distortion compensating circuit 202 that converts an input signal (a delay input signal transmitted from a second delay circuit that is described later) into a predistortion signal (a precompensation signal), using distortion compensating parameters that are read out from a lookup table 220. The predistortion signal is converted into an analog signal by a digital-to-analog converter 204, is modulated by a modulator 206, is amplified by a power amplifier 208, and is then transmitted via an antenna (not shown). Part of the transmission signal is supplied to a demodulator 212 via a distributor 210, is converted into a digital signal by an analog-to-digital converter 214 after demodulation, and is then combined with the other input of an error detecting circuit 216.

The amplifier device 200 includes a second delay circuit 224 that outputs a delay input signal obtained by delaying a transmission input signal, and a first delay circuit 218 that outputs a delay signal obtained by further delaying a delay input signal. The output (the delay input signal) of the second delay circuit 224 is input to the distortion compensating circuit 202. The amplifier device 200 further includes en error detecting circuit 216 that generates an error signal based on the difference between the delay signal transmitted from the first delay circuit 218 and a feedback signal transmitted from the analog-to-digital converter 214, and then outputs the error signal to the lookup table 220. The amount of delay in the first delay circuit 218 and the amount of delay in the second delay circuit 224 are determined by a control signal transmitted from the error detecting circuit 216. The distributor 210, the demodulator 212, the analog-to-digital converter 214, the error detecting circuit 216, and the lookup table 220 constitute a calculator 226 that calculates the distortion compensating parameters that are used in the predistortion compensation by the distortion compensating circuit 202, based on the difference between the signal transmitted from the first delay circuit and the amplified signal.

Next, the operation of the amplifier device 200 is described. The operation of the amplifier device 200 is the same as the operation of the amplifier device 100 of FIG. 1 in that the distortion compensating circuit 202 beforehand performs a distortion compensating operation to compensate for the nonlinearities of the power amplifier 208 or the like. In this embodiment, however, a transmission input signal is not directly input to the input end of the distortion compensating circuit 202, but a delay input signal that is obtained by delaying the transmission input signal by a time $T_2$ (the delay amount $T_2$ should preferably be larger than a later described value defined as $\Delta T$).

The delay input signal is input to the distortion compensating circuit 202, which controls the amplitude and phase of the delay input signal in accordance with the distortion compensating parameters supplied from the lookup table 220. The control is the distortion compensating operation to be performed to give the delay input signal the distortion of the opposite characteristics to non-linear distortion that is caused later due to the modulator 206 and the power amplifier 208. Through the distortion compensating operation, a desired output can be obtained even after the non-linear distortion is caused. The delay input signal, which has the amplitude and phase adjusted, is output as a transmission output signal via the digital-to-analog converter 204, the modulator 206, and the power amplifier 208, and is then transmitted from an antenna of a later stage. Part of the transmission output signal is introduced into a feedback loop by the distributor 210, and passes through the demodulator 212 and the analog-to-digital converter 214. The analog-to-digital converter 214 converts the part of the transmission output signal into a digital signal (a feedback signal) to be compared with a delay input signal in the error detecting circuit 216. Meanwhile, the delay input signal transmitted from the second delay circuit 224 is also input to the first delay circuit 218. The first delay circuit 218 delays the delay input signal by a predetermined delay amount $T_1$ and outputs a delay signal. The delay amount $T_1$ is determined to compensate for the delay caused while the delay input signal passes through the circuit from the distortion compensating circuit 202 through the distributor 210 and reaches the error detecting circuit 216.

The error detecting circuit 216 compares the delay signal with the feedback signal to generate an error signal. To perform adaptive control to minimize the error signal, the distortion compensating parameters in the lookup table 220 are updated. The adaptive control can be performed according to a known adaptation algorithm such as the least-squares algorithm or the sequential correction algorithm.

Next, the following procedures are carried out on the assumption that the characteristics of the analog devices used in the modulator 206 and the power amplifier 208 vary with time, and the delay amount caused while a delay input signal passes through these devices also varies. More specifically, the delay amount caused between the time when a delay input signal enters the distortion compensation circuit 202 and the time when the delay input signal reaches the error detecting circuit 216 via the distributor 210 changes from $T_1$ to $T_1+\Delta T$. The delay amount at the delay circuit 218 is $T_1$, and the difference between the delay input signal and the feedback signal is $\Delta T$. At the error detecting circuit 216, the above described adaptive control is performed so as to determine the conditions for minimizing the error signal, and consequently the delay amount at the first delay circuit 218 is changed from $T_1$ to $T_1+\Delta T$. Thus, the error detecting circuit 216 can compare signals that are equal to each other in terms of time.

Unlike the prior art, the second delay circuit 224 of this embodiment changes the delay amount from $T_2$ to $T_2-\Delta T$, based on a control signal transmitted from the error detecting circuit 216. A transmission input signal is delayed by $T_2-\Delta T$, to form a delay input signal. Here, "$-\Delta T$" is equivalent to the value obtained by inverting the sign of "$\Delta T$" that is given to the first delay circuit 218. The merits of the delay amounts that are set at the first and second delay circuits 218 and 224, respectively, are as follows. First, prior to the updating of the delay amount $T_1$ at the delay circuit, a transmission input signal that is input to the second delay circuit 224 is delayed by $T_2$ at the second delay circuit 224, and is further delayed by Tn between the distortion compensating circuit 202 and the distributor 210. Accordingly, the total delay caused between the input end of the second delay circuit 224 and the output end of the distributor 210 is $T_2+Tn(1)$.

Next, when Tn changes to $Tn+\Delta T$ as the delay amount at the modulator 206 and the power amplifier 208 varies, as described above, the delay amount at the first delay circuit 218 is updated to $T_1+\Delta T$ so that the signals of the same timing can be compared with each other at the error detecting circuit 216. Also, the delay amount at the second delay circuit 224 is updated to $T_2-\Delta T$.

Consequently, the delay caused between the input end of the second delay circuit 224 and the output end of the distributor 210 after the updating of the delay amount at the first delay circuit 218 is $(T_2-\Delta T)+(Tn+\Delta T)=T_2+Tn$, which is equal to the delay amount (1) ($T_2+Tn$) prior to the updating of the delay amount at the delay circuit for the distortion compensation. This means that the time (delay time) between the inputting of a transmission signal and the outputting of the transmission signal in the amplifier device 200 can be made uniform before and after the updating of the delay amount at the delay circuit for the distortion compensation. The delay variation $\Delta T$ may take a positive value or a negative value, because such a delay amount as to cancel the delay amount to be introduced into the first delay circuit 218 is introduced into the second delay circuit 224. For example, $T_1+T_2$ represents several tens of microseconds, and $\Delta T$ represents several tens of nanoseconds.

In general, the variation in delay between the input end of the second delay circuit 224 and the output end of the distributor 210 is greater than the variation in delay between the distributor 210 and the input end of the error detecting circuit 216. This is because the former involves a larger delay amount as the signal passes through analog filters, a number of amplifier stages, and more analog devices than a transmission signal of the latter, and the former is more easily affected by a temperature change, a change in properties with time, or the like. As well as the variation in the delay amount in the analog region, a variation in the delay amount may theoretically be caused in the digital region. However, unlike a delay amount caused with the analog devices, a delay amount caused with digital devices should be so small as to be ignored, as long as the clock signal is accurate. Accordingly, the variation in the delay amount in the feedback region can be ignored on the assumption that the cause of the delay $\Delta T$ mainly lies in the region between the distortion compensating circuit 202 and the distributor 210. Thus, even if the control operation to add $(-\Delta T)$ to the second delay circuit 224 is performed, the delay time of the main signal in the amplifier device 200 can be maintained substantially uniform.

Figure 3:
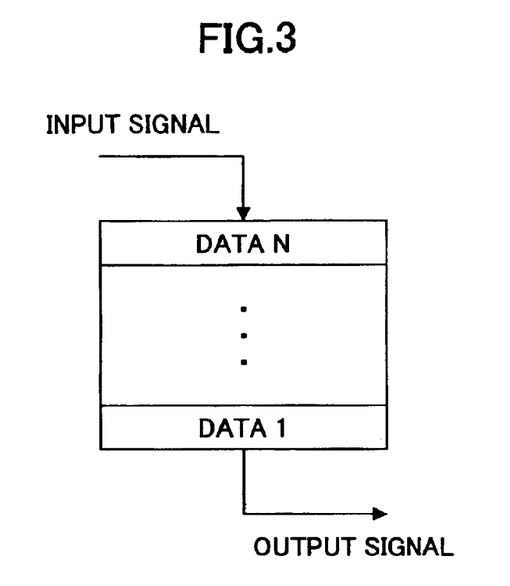
FIG. 3 is a schematic view of a delay circuit that can be employed for the first or the second delay circuit.
Figure 4:
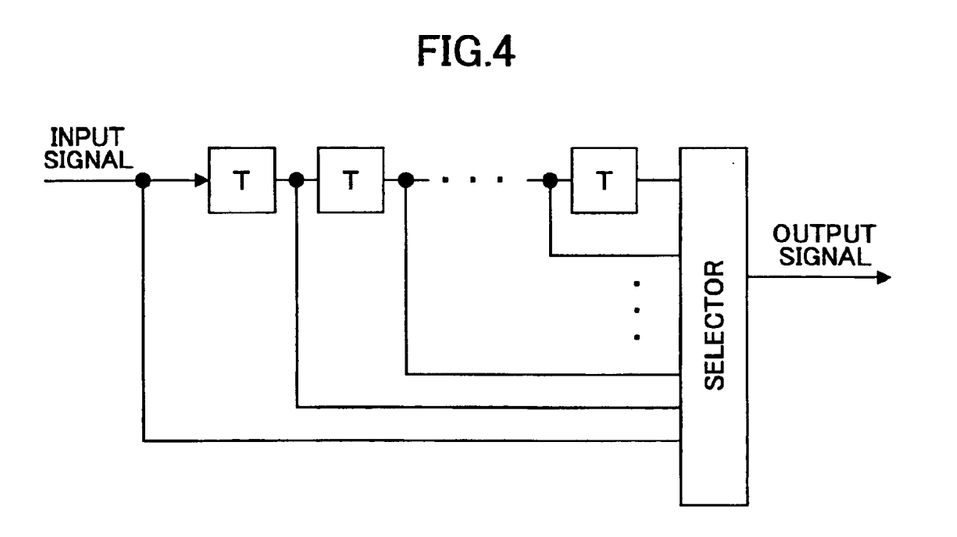
FIG. 4 is a schematic view of a delay circuit that can be employed for the first or the second delay circuit.

FIGS. 3 and 4 show memories that can be employed for the first delay circuit 218 and the second delay circuit 224 of FIG. 2. FIG. 3 shows a case where a delay circuit is formed with a FIFO memory (First-In, First-Out Memory). The transmission input signal or the delay input signal of FIG. 2 can be used as an input signal. This type of memory is designed to first retrieve the data item that is stored first. Data item 1 through data item N are written sequentially, and data item N+1 and the items that follow are overwritten on the data item 1 through the data item N. This process is cyclically repeated. When a period of time equivalent to the set delay amount has passed since an input signal is input, the data items are sequentially and cyclically retrieved through the output end. In this manner, a delay circuit can be formed.

FIG. 4 shows a case where a delay circuit is formed with a selector and delay devices like flip-flop circuits. This delay circuit includes delay devices T that are connected in series, and a selector that is connected to the output side of each of the delay devices. An input signal is input to the delay device located on one end of the delay devices connected in series, and the memory contents of the input signal gradually vary as the clock advances (in the drawing, the contents vary as the signal moves from left to right). Based on a control signal, the selector selects one of the outputs of the delay devices, and outputs the selected one as an output signal. If the selector selects the output of the delay device located on the right-most end, for example, a signal that is delayed by the largest possible delay amount (equivalent to the total number of delay devices) can be output.

Figure 5:
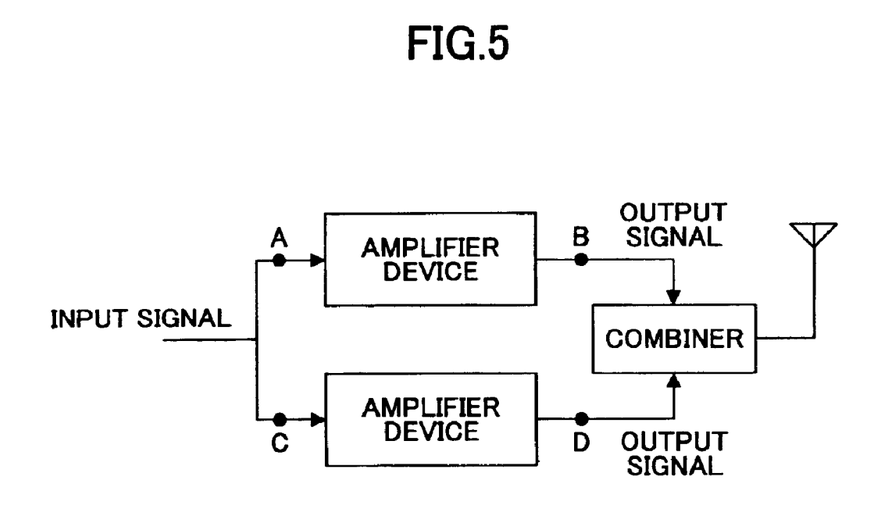
FIG. 5 is a schematic view of an amplifier system that utilizes amplifier devices in accordance with an embodiment of the present invention.
Figure 6:
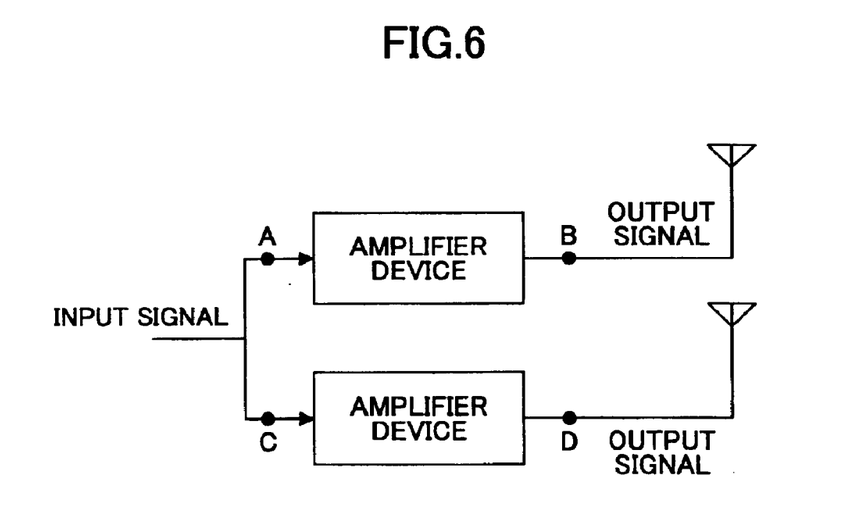
FIG. 6 is a schematic view of an amplifier system that utilizes amplifier devices in accordance with an embodiment of the present invention.

FIGS. 5 and 6 show example structures in which two or more amplifier devices 200 of FIG. 2 are prepared and are operated in parallel. FIG. 5 shows a structure in which a transmission input signal is input to two amplifier devices, and the outputs of the amplifier devices are parallel-combined by a combiner. The combined outputs are then output through an antenna. As long as the delay time between point A and point B is matched with the delay time between point C and point D in the initial state, the output signals can be input to the combiner in the same timing even if the delay amount is updated at the first delay circuit 218 in each of the amplifier devices. Thus, a preferred combining operation can be performed. In this example, the outputs of the two amplifier devices are combined in parallel in terms of circuitry. Accordingly, a large amount of electric power can be obtained. Furthermore, even if one of the amplifier devices breaks down, transmission can be continued with a half of the output. Thus, a stoppage of transmission can be avoided, and a highly reliable system can be manufactured.

The structure shown in FIG. 6 is the same as the structure shown in FIG. 5 in that a transmission input signal is input to two amplifier devices. However, the structure shown in FIG. 6 differs from the structure shown in FIG. 5 in that the signals amplified by the respective amplifier devices are spatially combined with each other (diversity combining). In this case, the delay amounts required for signals passing through the amplifier devices are maintained uniform, so that a preferred spatial combining operation can be performed. Through the spatial combining operation, power loss caused when the combining is performed is smaller than in a case where outputs are combined in terms of circuitry prior to transmission. Also, with the two antennas, it is easy to form a beam waveform that cannot be easily formed with a single antenna. Although the number of amplifier circuits is two in each of FIGS. 5 and 6 for ease of explanation, three or more amplifier devices can be operated in parallel.

Figure 7:
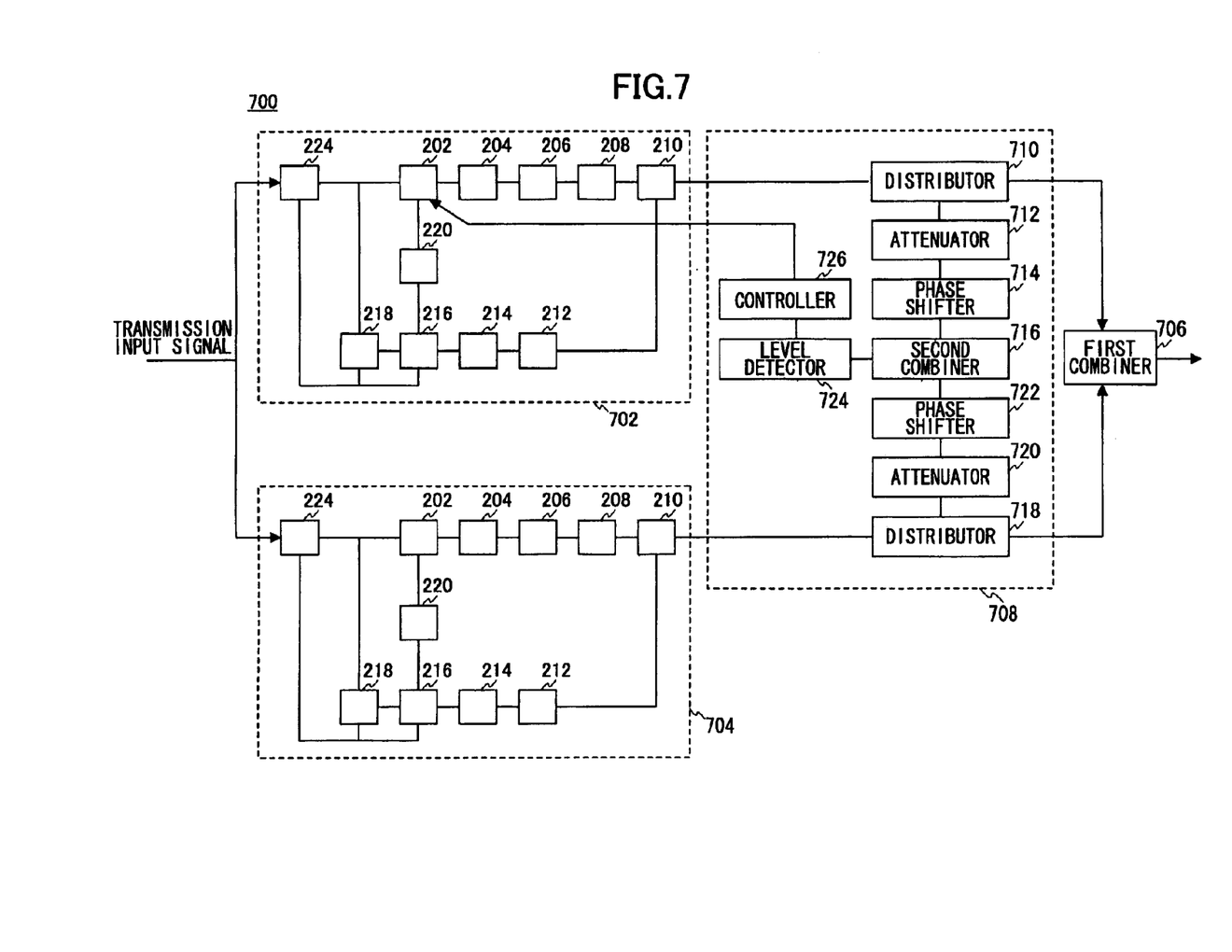
FIG. 7 is a block diagram of an amplifier system in accordance with a second embodiment of the present invention.

FIG. 7 is a block diagram illustrating an amplifier system 700 in accordance with a second embodiment of the present invention. The amplifier system 700 includes first and second amplifier devices 702 and 704 that receive a transmission input signal. The first and second amplifier devices 702 and 704 each have the same structure as the structure shown in FIG. 2, and therefore, explanation of them is omitted herein. The outputs of these amplifier devices are combined in terms of circuitry by a first combiner 706. The amplifier system 700 of this embodiment further includes a phase difference detecting circuit 708 that detects the phase difference between the output signals transmitted from the respective amplifier devices 702 and 704. As described earlier, the delay amounts in the first and second amplifier devices 702 and 704 are maintained uniform. However, a phase difference might be caused due to the carrier of each output signal, as well as the temperature characteristics and a change in properties with time. The phase difference detecting circuit 708 detects such a phase difference and compensates for it.

The phase difference detecting circuit 708 includes a distributor 710 that is connected to the distributor 210 of the first amplifier device 702, and extracts part of the transmission output signal transmitted from the first amplifier device 702. The extracted signal is input to an attenuator 712. The signal that is attenuated to a suitable level by the attenuator 712 is then input to a phase shifter 714 that adjusts the phase of the signal. The output of the phase shifter 714 is supplied to one of the input ends of a second combiner 716. If the signal level extracted from the distributor 210 of the first amplifier device 702 is high enough, the signal extracted from the distributor 210 can be input to the attenuator 712 or the phase shifter 714, as well as to the demodulator 212. The transmission output signal output from the second amplifier device 704 is supplied to the other input end of the second combiner 716, after passing through a distributor 718, an attenuator 720, and a phase shifter 722. The second combiner 716 outputs a compound signal obtained by combining the signals transmitted through the respective signal paths. Based on the compound signal, a level detector 724 detects the phase difference and outputs the phase difference to a controller 726. The controller 726 then outputs a control signal to the distortion compensating circuit 202 of the first amplifier device 702.

When the largest possible compound output is to be obtained from the first combiner 706, the phase shifters 714 and 722 adjust the phases so that the smallest possible compound output can be obtained from the second combiner 716. In short, the adjustment is made so that outputs of the opposite phases are combined. The phases to be adjusted represent the relative values between the signals. Therefore, it is theoretically possible to make a phase adjustment with either one of the two phase shifters 714 and 722. However, to facilitate the phase adjusting process in practice, it is preferable to employ a phase shifter in each of the two signal paths.

The signals having the phases adjusted in the above manner are then combined by the second combiner 716. Where the largest possible compound output is to be obtained from the first combiner 706, such a phase adjustment is made as to obtain the smallest possible compound output from the second combiner 716. Therefore, the signal level detected by the level detector 724 represents the size of the phase difference. More specifically, the size of the compound output depends on the detected signal level, and also depends on the size of the phase difference. Therefore, to reduce the phase difference, it is necessary to perform such a control operation as to lower the signal level to be detected. The controller 726 utilizes a known adaptation algorithm such as the least-squares algorithm or a successive approximation algorithm, to determine such a phase difference as to minimize the signal level obtained from the level detector 724. The controller 726 then instructs the distortion compensating circuit 202 of the first amplifier device 702 to give such a phase angle to the delay input signal as to compensate for the phase difference. By doing so, the signal combining process can be performed not only after the delay amounts in the first and second amplifier device 702 and 704 are adjusted, but also after the phase difference between the signals output from the first and second amplifier devices 702 and 704 is adjusted.

This embodiment can be realized by simply adding the phase difference detecting circuit 708 to the system, without any change to the structures of the first and second amplifier devices 702 and 704. Therefore, this embodiment is preferable because of its simplicity.

Although the combining of transmission outputs is performed separately from the combining for detecting a phase difference in this embodiment, it is not necessary to perform these two combining operations separately from one another to detect a difference from the optimum value of the combined transmission outputs. For example, it is theoretically possible to detect a phase difference by extracting part of the output from the first combiner 706. However, to detect a phase difference with high precision while minimizing the signal loss with respect to the signal extraction, the structure of this embodiment is more preferable. Since the signal loss caused when a small-power signal is extracted prior to the combining process is smaller than the signal loss caused when the larger power signal is extracted after the combining process, a signal extracting operation can be performed with high precision in accordance with this embodiment.

In this embodiment, the controller 726 instructs the distortion compensating circuit 202 to provide a phase angle to compensate for a phase difference. However, it is also possible to give such an instruction to the error detecting circuit 216 to compensate for a phase difference. In any way, a suitable phase angle should be given to the delay input signal.

Although the structure of this embodiment is designed to adjust the phase of the signal transmitted from the first amplifier device 702, it is also possible to adjust the phase of the signal transmitted from the second amplifier device 704 or to adjust the phases of both signals. This is because the phase to be adjusted represents the relative amount between the signals, as mentioned earlier.

In this embodiment, the phase difference detecting circuit 708 is applied to an amplifier system that combines signals in terms of circuitry, as shown in FIG. 5. However, it is also possible to employ the phase difference detecting circuit 708 in an amplifier system that performs a diversity combining operation as shown in FIG. 6. In such a case, the first combiner 706 is not employed, but the outputs of the distributors 710 and 718 should be connected to antennas that are independent of each other.

Figure 8:
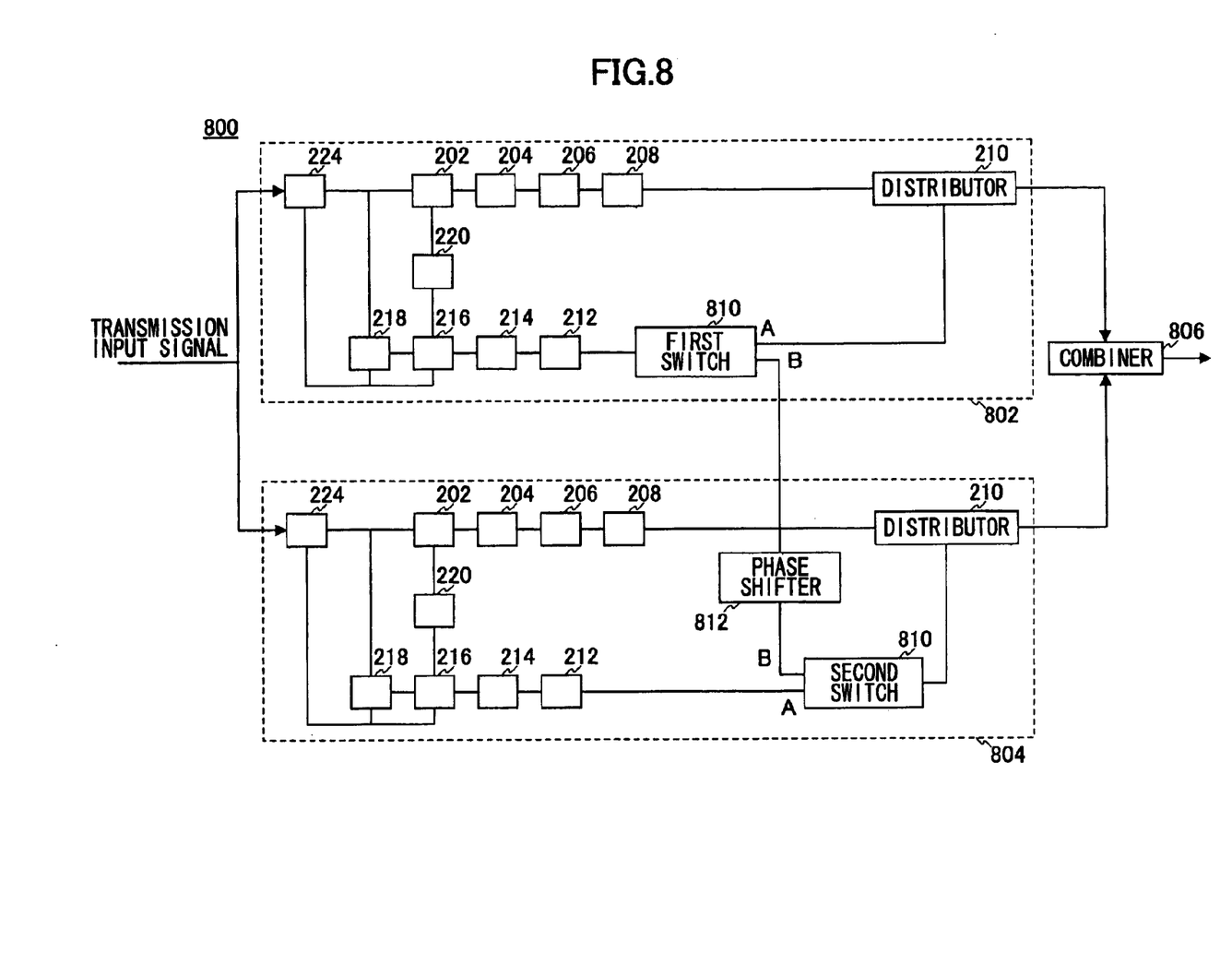
FIG. 8 is a block diagram of an amplifier system in accordance with an embodiment of the present invention.

FIG. 8 is a block diagram illustrating an amplifier system 800 in accordance with a third embodiment of the present invention. The amplifier system 800 includes amplifier devices 802 and 804 that receive a transmission input signal. The first and second amplifier devices 802 and 804 each have the same structure as the structure shown in FIG. 2, and therefore, explanation of like components is omitted herein. The outputs of these amplifier devices are combined in terms of circuitry by a combiner 806, and are connected to an antenna (not shown). The amplifier system 800 of this embodiment further includes a first switch 808 that is connected to the demodulator 212 of the first amplifier device 802. An input end A of the two input ends of the first switch 808 is connected to the distributor 210. The amplifier system 800 further includes a second switch 810 that is connected to the distributor 210 of the second amplifier device 804. An output end A of the two output ends of the second switch 810 is connected to the demodulator 212 of the second amplifier device 804. The other output end B of the second switch 810 is connected to the other input end B of the first switch 808 via a phase shifter 812.

The amplifier system 800 has two operating modes: a normal operating mode and a phase adjusting mode. In the normal operating mode, the first switch 808 outputs the input through the input end A to the demodulator 212, and the second switch 810 outputs the input from the output end A. In this operating mode, the amplifier devices 802 and 804 operate in parallel and independently of each other in the same manner as described in conjunction with the structure shown in FIG. 5.

In the phase adjusting mode, the first switch 808 outputs the input received through the other input end B to the demodulator 212, and the second switch 810 outputs the input from the other output B. The output from the second switch 810 is input to the other input end B of the first switch 808 via the phase shifter 812, and is then input to the demodulator 212 of the first amplifier device 802. At the phase shifter 812, the phase between the distributor 210 of the second amplifier device 804 and the first switch 808 is adjusted to be equal to the phase between the distributor 210 of the first amplifier device 802 and the first switch 808.

In this operating mode, the first amplifier device 802 generates a feedback signal based on the transmission signal from the second amplifier device 804, instead of the transmission output signal of the first amplifier device 802. The error detecting circuits 216 then compare the signals with each other. If the passing phases at the power amplifiers of the respective amplifier devices 802 and 804 are equal to each other, the phase difference is zero. If the passing phases at the power amplifiers are different from each other, the error detecting circuit 216 of the first amplifier device 802 detects the phase difference. The error detecting circuit 216 then instructs the distortion compensating circuit 202 of the second amplifier device 804 to provide such a phase angle as to compensate for the phase difference. Here, the phase difference may be adjusted in the first amplifier device 802, instead of the second amplifier 804, because the phase difference to be adjusted represents the difference between the signals. After the phase adjustment, the operating mode is switched to the normal operating mode. Since a change in properties with time or a temperature change does not occur very often, the first and second switches 808 and 810 do not need to be switched so often, either. For example, it should be sufficient to switch the first and second switches 808 and 810 once in every few tens of minutes.

In accordance with this embodiment, the newly added devices are the first switch 808, the second switch 810, and the phase shifter 812. As the phase detecting operation can be performed with a smaller number of devices, this embodiment is more preferable.

Although this embodiment is applied to an amplifier system that combines signals in terms of circuitry as shown in FIG. 5, it is also possible to apply this embodiment to an amplifier system that performs the diversity combining operation as shown in FIG. 6. In such a case, the combiner 806 is not employed, and the outputs of the respective distributors 210 should be connected to antennas that are independent of each other.

As described above, in accordance with this embodiment, the delay amount in the first delay circuit is adjusted based on the difference between a feedback signal and a delay signal, and the delay amount in the second delay circuit is adjusted so as to cancel the delay amount. By doing so, the delay amount between a transmission input signal and a transmission output signal can be maintained uniform, even if the delay characteristics of the signal path vary with time.

In accordance with this embodiment, the amplifier devices in the respective signal paths can maintain uniform delay amounts. Accordingly, it becomes possible to combine amplified outputs that are delayed by the same amounts. Thus, the outputs can be properly combined spatially or in terms of circuitry.

Also, in accordance with this embodiment, the phase difference between the signals output from the respective amplifier devices is detected, and the phase angle of the predistortion signal (the precompensation signal) is adjusted so as to compensate for the phase difference. By doing so, not only the delay amount between the transmission input signal and the transmission output signal but also the phase shift caused by a carrier wave can be adjusted, and a more preferable output combining operation can be performed.

In accordance with this embodiment, the phase difference is detected by a combiner that combines the output signals output from the respective amplifier devices. Accordingly, the optimum value for a compound signal can be directly determined, and an amplifier system of the present invention can be easily and directly realized.

In accordance with this embodiment, switches are employed for switching signal paths, and a feedback signal of an amplifier device is formed, based on the transmission output signal transmitted from the other amplifier device. Thus, the phase difference can be detected by the error detecting circuit of each amplifier device, without a complicated detector.

Although the present invention has been described by way of specific examples, it is not limited to them. Rather, the present invention can be applied to any amplifier device that performs digital predistortion compensation.

What is claimed is:

1. A distortion compensating amplifier device of a digital predistortion type, comprising:
    a second delay circuit that delays a transmission input signal;
    a distortion compensating circuit that performs predistortion compensation on the delayed signal, using a distortion compensating parameter;
    an amplifier that amplifies the signal subjected to the predistortion compensation;
    a first delay circuit that further delays the signal delayed by the second delay circuit; and
    a calculator that calculates the distortion compensating parameter to be used in the predistortion compensation, based on the difference between the signal output from the first delay circuit and the amplified signal.

2. The distortion compensating amplifier device as claimed in claim 1, wherein the calculator comprises:
    a controller that performs a control operation to change a delay amount at the first delay circuit in accordance with the difference, and a control operation to make a change to a delay amount at the second delay circuit, the change being opposite to the change made to the delay amount at the first delay circuit.

3. The distortion compensating amplifier device as claimed in claim 2, wherein the change made to the delay amount at the first delay circuit is equal in size to the change made to the delay amount at the second delay circuit.

4. The distortion compensating amplifier device as claimed in claim 1, wherein the second delay circuit is formed with a first-in, first-out memory.

5. The distortion compensating amplifier device as claimed in claim 1, the second delay circuit comprising:
    a plurality of delay devices which delay devices are connected in series; and
    a selector that selects one output of the delay devices.

6. An amplifier system comprising:
    a plurality of amplifier devices which amplifier devices are connected to two or more antennas independently of one another, each of the amplifier devices including
    a second delay circuit that delays a transmission input signal;
    a distortion compensating circuit that performs predistortion compensation on the delayed signal, using a distortion compensating parameter;
    an amplifier that amplifies the signal subjected to the predistortion compensation;
    a first delay circuit that further delays the signal delayed by the second delay circuit; and
    a calculator that calculates the distortion compensating parameter to be used in the predistortion compensation, based on the difference between the signal output from the first delay circuit and the amplified signal.

7. The amplifier system as claimed in claim 6, wherein the phase difference between transmission output signals output from the amplifier devices is detected, and the phase angle of the signal subjected to the predistortion compensation is adjusted so as to compensate for the phase difference.

8. The amplifier system as claimed in claim 7, further comprising:
    a combiner that combines output signals from two or more of the amplifier devices;
    wherein the phase difference is detected in accordance with the signal level output from the combiner.

9. The amplifier system as claimed in claim 7, further comprising:
    a switch that switches signal paths so that a feedback signal of one of the amplifier devices is formed based on the output signal of another one of the amplifier devices.

10. An amplifier system comprising:
    a plurality of amplifier devices; and
    a first combiner that is connected to an antenna and combines output signals transmitted from the amplifier devices;
    each of the amplifier devices including
    a second delay circuit that delays a transmission input signal;
    a distortion compensating circuit that performs predistortion compensation on the delayed signal, using a distortion compensating parameter;
    an amplifier that amplifies the signal subjected to the predistortion compensation;
    a first delay circuit that further delays the signal delayed by the second delay circuit; and
    a calculator that calculates the distortion compensating parameter to be used in the predistortion compensation, based on the difference between the signal output from the first delay circuit and the amplified signal.

11. The amplifier system as claimed in claim 10, wherein the phase difference between transmission output signals output from the amplifier devices is detected, and the phase angle of the signal subjected to the predistortion compensation is adjusted so as to compensate for the phase difference.

12. The amplifier system as claimed in claim 11, further comprising:
    a second combiner that combines output signals from two or more of the amplifier devices;
    wherein the phase difference is detected in accordance with the signal level output from the combiner.

13. The amplifier system as claimed in claim 11, further comprising:
    a switch that switches signal paths so that a feedback signal of one of the amplifier devices is formed based on the output signal of another one of the amplifier devices.

14. A wireless base station for a mobile communication system, comprising:

a plurality of distortion compensating amplifier devices of a digital predistortion type;

each of the distortion compensating amplifier devices including a second delay circuit that delays a transmission input signal;

a distortion compensating circuit that performs predistortion compensation on the delayed signal, using a distortion compensating parameter;

an amplifier that amplifies the signal subjected to the predistortion compensation;

a first delay circuit that further delays the signal delayed by the second delay circuit; and a calculator that calculates the distortion compensating parameter to be used in the predistortion compensation, based on the difference between the signal output from the first delay circuit and the amplified signal.

15. The wireless base station as claimed in claim 14, the calculator comprising:

a controller that performs a control operation to change a delay amount at the first delay circuit in accordance with the difference, and a control operation to make a change to a delay amount at the second delay circuit, the change being opposite to the change made to the delay amount at the first delay circuit.

* * * * *